(12) United States Patent
Inoue et al.

(10) Patent No.: US 7,942,550 B2
(45) Date of Patent: May 17, 2011

(54) LIGHT EMITTING DEVICE AND BACKLIGHT UNIT INCLUDING THE SAME

(75) Inventors: Tomio Inoue, Suwon (KR); Yu Dong Kim, Suwon (KR); Jae Woo Cho, Suwon (KR); Ok Hee Shin, Suwon (KR)

(73) Assignee: Samsung LED Co., Ltd., Suwon, Gyunggi-Do (KR)

( * ) Notice: Subject to any disclaimer, the term of this patent is extended or adjusted under 35 U.S.C. 154(b) by 279 days.

(21) Appl. No.: 12/276,250

(22) Filed: Nov. 21, 2008

(65) Prior Publication Data

US 2010/0014279 A1 Jan. 21, 2010

(30) Foreign Application Priority Data

Jul. 16, 2008 (KR) .................. 10-2008-0069185

(51) Int. Cl.
*F21S 4/00* (2006.01)
*F21V 21/00* (2006.01)
(52) U.S. Cl. .............. 362/249.02; 362/97.3; 362/612; 362/800; 257/98; 257/99; 313/498
(58) Field of Classification Search .............. 362/97.3, 362/545, 249.02, 612, 800; 257/98, 99; 313/498
See application file for complete search history.

(56) References Cited

U.S. PATENT DOCUMENTS 7,391,153 B2 * 6/2008 Suehiro et al. ............ 362/800
2009/0134413 A1 * 5/2009 Roth et al. ................ 257/98

FOREIGN PATENT DOCUMENTS

JP 2005-277227 10/2005
KR 2003-0093774 12/2003

* cited by examiner

*Primary Examiner* — Stephen F Husar
(74) *Attorney, Agent, or Firm* — McDermott Will & Emery LLP

(57) ABSTRACT

There are provided a light emitting device and a backlight unit including the same. The light emitting device includes a package body having opposing first and second main surfaces and side surfaces, and formed of a curable resin; first and second external terminal blocks opposing each other and each having first and second surfaces formed on the first and second main surfaces and side surfaces, the first and second external terminal blocks each including a connecting part having a bonding portion located inside the package body and a terminal portion connected to the bonding portion and exposed outward; and an LED chip including an electrode forming surface where first and second electrodes are formed and a light emitting surface located opposite to the electrode forming surface, the LED chip having the first and second electrodes electrically connected to the bonding portions of the first and second external terminal blocks, respectively.

18 Claims, 6 Drawing Sheets

LIGHT EMITTING DEVICE AND BACKLIGHT UNIT INCLUDING THE SAME

CROSS-REFERENCE TO RELATED APPLICATIONS

This application claims the priority of Korean Patent Application No. 2008-0069185 filed on Jul. 16, 2008, in the Korean Intellectual Property Office, the disclosure of which is incorporated herein by reference.

BACKGROUND OF THE INVENTION

1. Field of the Invention

The present invention relates to a light emitting device and a backlight unit including the same, and more particularly, to a light emitting device including a semiconductor light emitting diode chip.

2. Description of the Related Art

In general, a light emitting device including a light emitting diode (LED) chip widely utilizes a package structure with a case having a white resin injection-molded in a lead frame. In this light emitting device, an LED chip is mounted in a groove of the case to connect to the lead frame and then a resin is filled in the groove. Particularly, to manufacture the white light emitting device, the resin filled in the groove may contain a phosphor powder.

However, the conventional light emitting device has some drawbacks in terms of miniaturization and yield.

For example, a side view light emitting device, which is chiefly employed as a backlight source of a display of a mobile phone and capable of being surface-mounted, significantly needs to be thinner due to a greater thinness of the mobile phone. However, in the conventional light emitting device structure, a groove should be formed to mount the LED chip therein, and accordingly, the case provided with the groove can be hardly manufactured in a sufficiently smaller size.

Furthermore, the process of injection-molding the case together with the lead frame is followed by complex processes of mounting the LED chip and providing the resin encapsulant in the groove. Therefore, this degrades yield and increases process costs.

Particularly, in a white light emitting device, when a liquid resin containing a phosphor powder is dispensed into the groove, the phosphor powder filled by the dispenser may have variations which lead to color unevenness.

Also, the light emitting device without such problems is required to ensure that an angle of view is not obstructed by other structures in the process of miniaturization. Notably, this angle of view should be assured more greatly in the side view light emitting device.

SUMMARY OF THE INVENTION

An aspect of the present invention provides a light emitting device which has a resin portion and a case configured separately unlike a conventional package and is reduced in size to achieve sufficient miniaturization and assure a sufficient angle of view, and a backlight unit including the same.

According to an aspect of the present invention, there is provided a light emitting device including: a package body having opposing first and second main surfaces and a plurality of side surfaces interposed therebetween, the package body formed of a curable resin; first and second external terminal blocks located to oppose each other and each having first and second surfaces formed on the first and second main surfaces and side surfaces interposed therebetween, the first and second external terminal blocks disposed at both ends of the package body, respectively and each including a connecting part having a bonding portion located inside the package body and a terminal portion connected to the bonding portion and exposed outward; and a light emitting diode chip including an electrode forming surface where first and second electrodes are formed and a light emitting surface located opposite to the electrode forming surface, the light emitting diode chip disposed between the first and second external terminal blocks in the package body and having the first and second electrodes electrically connected to the bonding portions of the first and second external terminal blocks, respectively, wherein the first main surface of the package body and the light emitting surface of the light emitting diode chip are protruded outward from the first surfaces of the first and second external terminal blocks.

The light emitting surface of the light emitting diode chip and the first main surface of the package body are co-planar with each other.

The light emitting device may further include a phosphor layer formed on the light emitting surface of the light emitting diode chip, wherein the phosphor layer has an outer surface co-planar with the first main surface of the package body.

The light emitting device may further include a phosphor layer formed on the first main surface of the package body.

The light emitting diode chip may emit blue light.

The curable resin of the package body may contain a high-reflectivity powder having electric insulativity. The high-reflectivity powder may be a $TiO_2$ powder.

The light emitting device may further include a resin layer formed to cover the first surfaces of the first and second external terminal blocks. The resin layer may contain a high-reflectivity powder having electric insulativity. The high-reflectivity powder may be a $TiO_2$.

The first and second external terminal blocks each may be formed of an insulating block having the connecting part. The connecting part may include an electrode layer formed on the second surface of each of the first and second external terminal blocks and a conductive via hole extending from the second surface to the first surface of the each of the first and second external terminal blocks. The conductive via hole of the each of the first and second external terminal blocks may be exposed to the side surfaces of the package body to serve as the terminal portion. The insulating block may be one of a ceramic block and a printed circuit board block. The ceramic block may include a porous structure.

The first and second electrodes may be electrically connected to the bonding portions of the external terminal blocks, respectively by wire bonding.

According to another aspect of the present invention, there is provided a backlight unit including: a light emitting device including: a package body having opposing first and second main surfaces and a plurality of side surface interposed therebetween, the package body formed of a curable resin; first and second external terminal blocks located to oppose each other and each having first and second surfaces formed on the first and second main surfaces and side surfaces interposed therebetween, the first and second external terminal blocks disposed at both ends of the package body, respectively and each including a connecting part having a bonding portion located inside the package body and a terminal portion connected to the bonding portion and exposed outward; and a light emitting diode chip including an electrode forming surface where first and second electrodes are formed and a light emitting surface located opposite to the electrode forming surface, the light emitting diode chip disposed between the first and second external terminal blocks in the package body and having the first and second electrodes electrically connected to the bonding portions of the first and second external terminal blocks, respectively, wherein the first main surface of the package body and the light emitting surface of the light emitting diode chip are protruded outward from the first surfaces of the first and second external terminal blocks; a guiding plate disposed adjacent to the light emitting surface of the light emitting device to change a path of light emitted from the light emitting device and guide the light outward, the guiding plate including a groove formed in a surface facing the same direction as the light emitting surface, wherein the light emitting device is arranged such that protruded portions of the first main surface of the package body and the light emitting surface of the light emitting diode chip are inserted into the groove.

BRIEF DESCRIPTION OF THE DRAWINGS

The above and other aspects, features and other advantages of the present invention will be more clearly understood from the following detailed description taken in conjunction with the accompanying drawings, in which.

DETAILED DESCRIPTION OF THE PREFERRED EMBODIMENT

Figure 1:
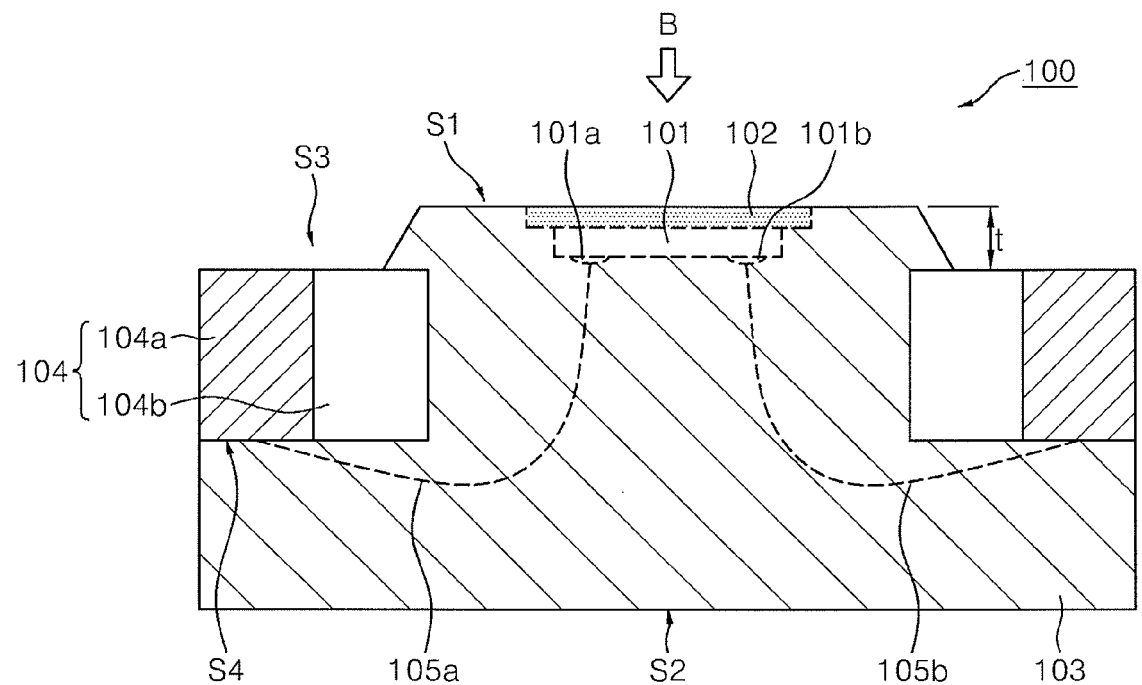
FIG. 1 is a side elevation view illustrating a light emitting device according to an exemplary embodiment of the invention.

Exemplary embodiments of the present invention will now be described in detail with reference to the accompanying drawings. This invention may, however, be embodied in many different forms and should not be construed as limited to the embodiments set forth herein. Rather, these embodiments are provided so that this disclosure will be thorough and complete, and will fully convey the scope of the invention to those skilled in the art. In the drawings, the shapes and dimensions may be exaggerated for clarity, and the same reference signs are used to designate the same or similar components throughout.

Figure 2:
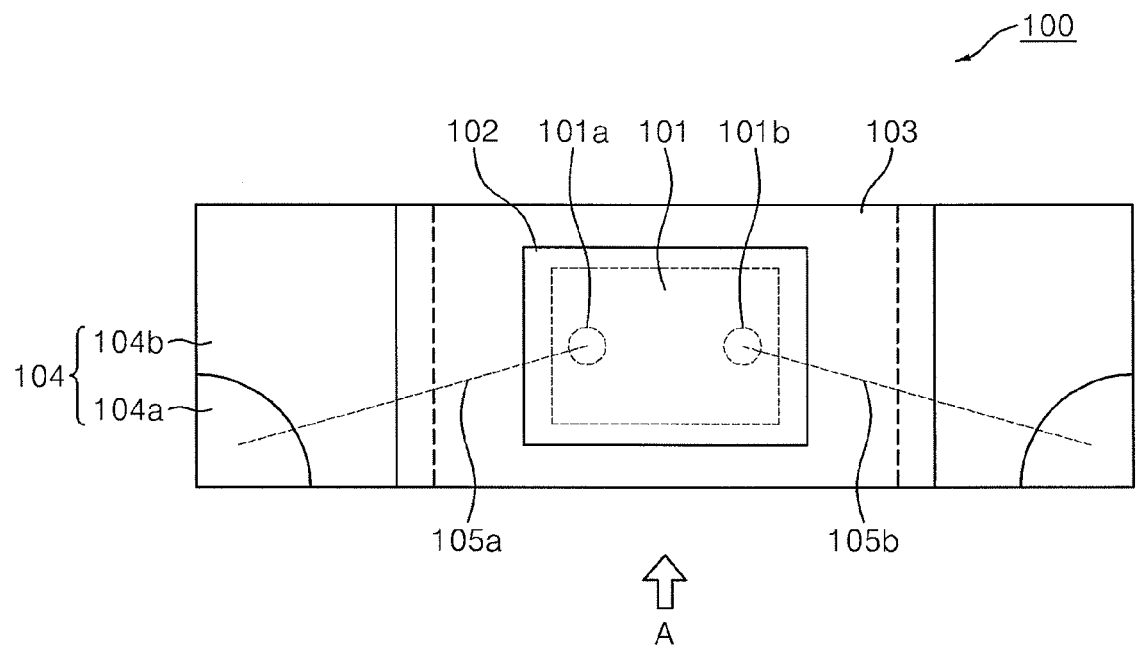
FIG. 2 is a plan view illustrating a light emitting device according to an exemplary embodiment of the invention.

FIG. 1 is a side elevation view illustrating a light emitting device according to an exemplary embodiment of the invention. FIG. 2 is a plan view illustrating a light emitting device according to an exemplary embodiment of the invention. That is, FIG. 1 is a side elevation view illustrating the light emitting device of FIG. 2, taken in an A direction and FIG. 2 is a plan view illustrating the light emitting device of FIG. 1, taken in a B direction.

Referring to FIGS. 1 and 2, the light emitting device 100 includes a package body 103 formed of a curable resin. The package body 103 includes first and second main surfaces S1 and S2 opposing each other and side surfaces disposed therebetween. Here, as will be described later with reference to FIG. 9, the package body 103 may be formed of a rectangular parallelepiped having four side surfaces, which can be achieved by dicing.

First and second external terminal blocks 104 are located at both ends of the package body 103. Each of the first and second external terminal blocks 104 includes opposing first and second surfaces S3 and S4 and side surfaces disposed therebetween. The first and second external terminal blocks 104 are arranged at the both ends of the package body 103 such that the first main surface S1 of the package body 103 is exposed outward from the first surface S3. The each external terminal block 104 is extended from inside the package body and includes a connecting part 104 exposed to the outside of the package body 18 and an insulating block 104b.

A light emitting diode chip 101 is disposed between the first and second external terminal blocks 104 inside the package body 103. Here, in the same manner as the first main surface S1 of the package body 103, the light emitting diode chip 101 is disposed such that a surface opposing a surface where first and second electrodes 101a and 101b are formed, i.e., electrode-forming surface is protruded outward from the first surface S3. Here, the surface opposing the electrode-forming surface serves to chiefly emit light generated from the light emitting diode chip 101 and thus can be defined as a light emitting surface.

As described above, the light emitting surface is protruded outward with respect to the package body 103. Therefore, as described later with respect to FIG. 6, the light emitting surface is connected to a guiding plate with minimum light loss. Moreover, the light emitting device 100, when mounted on a printed circuit board (PCB), may experience stress due to differences in thermal expansion coefficient from the PCB. Particularly, the light emitting device 100 undergoes relatively great stress between the first and second external terminal blocks 104. Accordingly, as in the present embodiment, the light emitting diode chip 101 is arranged to be protruded outward from an area between the first and second external terminal blocks 104 to reduce stress affecting the light emitting diode chip 101, thereby enhancing light emitting efficiency and reliability.

Meanwhile, the each of the first and second external terminal blocks 104 may include an insulating block 104b and a connecting part 104a extending through the first and second surfaces S3 and S4. Here, the insulating block 104b may be a ceramic substrate. The ceramic substrate employed for the insulating block 104b may be formed of a porous structure to ensure higher bonding with a resin. Alternatively, the insulating block 104b may be formed of a PCB resin material. At this time, the external terminal block 104 can be easily fabricated using the PCB.

The first and second electrodes 101a and 101b of the light emitting diode chip 101 may be electrically connected to the connecting part 104a exposed to the second surfaces S4 of the first and second external terminal blocks 104 through wires 105a and 105b, respectively.

Optionally, the each of the first and second external terminal blocks 104 may include an electrode layer (not shown)

formed on the second surface S4 thereof to ensure a larger bonding area. Moreover, the wires 105a and 105b may be provided inside the package body 103 to be protected. A phosphor layer 102 is formed on the light emitting surface of the light emitting diode chip 101. Here, the phosphor layer 102 may be co-planar with the first main surface S1. Alternatively, the phosphor layer 102 may be formed outside the first main surface S1. The phosphor layer 102 may be formed of a resin layer containing a phosphor material capable of changing a wavelength of light emitted from the light emitting diode chip 101 to emit white light outward. To this end, the light emitting diode chip 101 may utilize a material capable of emitting blue light.

The curable resin for the package body 103 may have low refractivity to prevent light generated from the light emitting diode chip 101 from entering inside the package body 103 and ensure that light is easily extracted toward the phosphor layer 102. For example, the curable resin may employ a transparent resin having a refractivity of about 1.5 or less. The curable resin for forming the package body 103 may contain a high reflectivity powder having electric insulativity to further ensure the light is extracted in a desired light emitting direction. A desired high reflectivity powder may utilize a $TiO_2$ powder.

Meanwhile, in the present embodiment, each of the first and second external terminal blocks 104 may have three of the side surfaces of the package body 103 exposed, except for the surface facing the same direction as a light emitting surface. Particularly, the connecting part 104a may be exposed to two adjacent ones of the side surfaces to serve as a terminal portion connected to an external device. As shown in FIG. 2, the connecting part 104a of the first and second external terminal blocks 104 may be exposed to an identical one of the side surfaces of the package body 103 to serve as an external terminal portion of the light emitting device 100. The light emitting device 100 structured as above is effectively employed as a side view LED package. However, the present invention is not limited thereto, but the external terminal block may be varied in structure.

Figure 3:
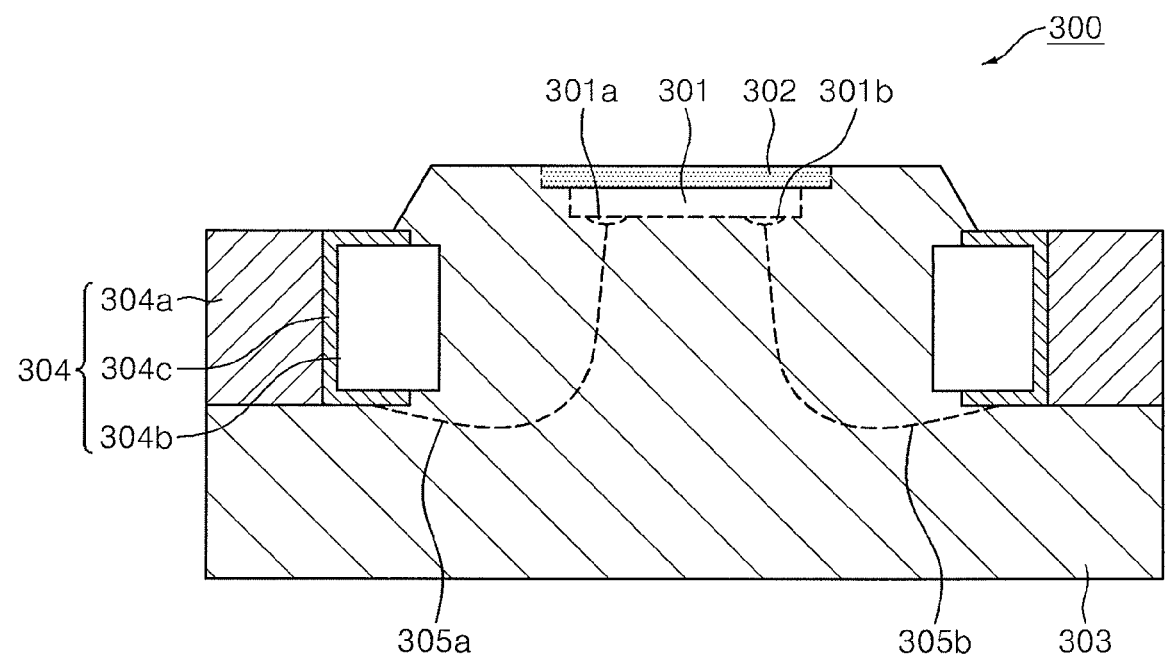
FIG. 3 is a cross-sectional view illustrating a light emitting device according to a modified embodiment of FIG. 1.
Figure 4:
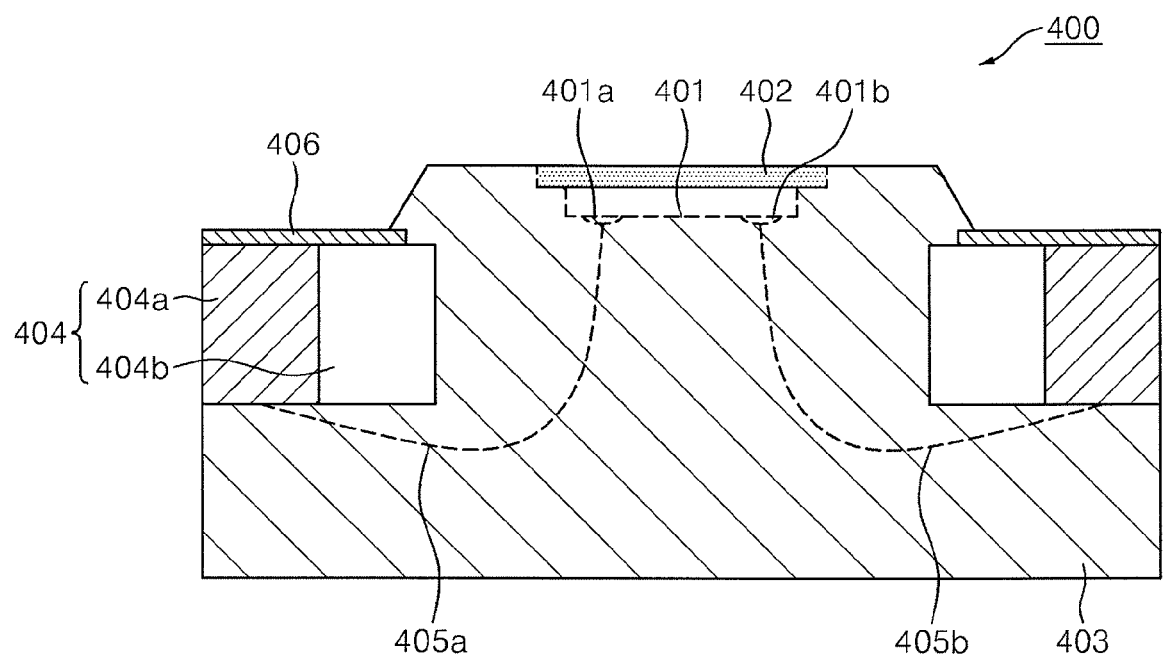
FIG. 4 is a cross-sectional view illustrating a light emitting device according to another modified embodiment of FIG. 1.
Figure 5:
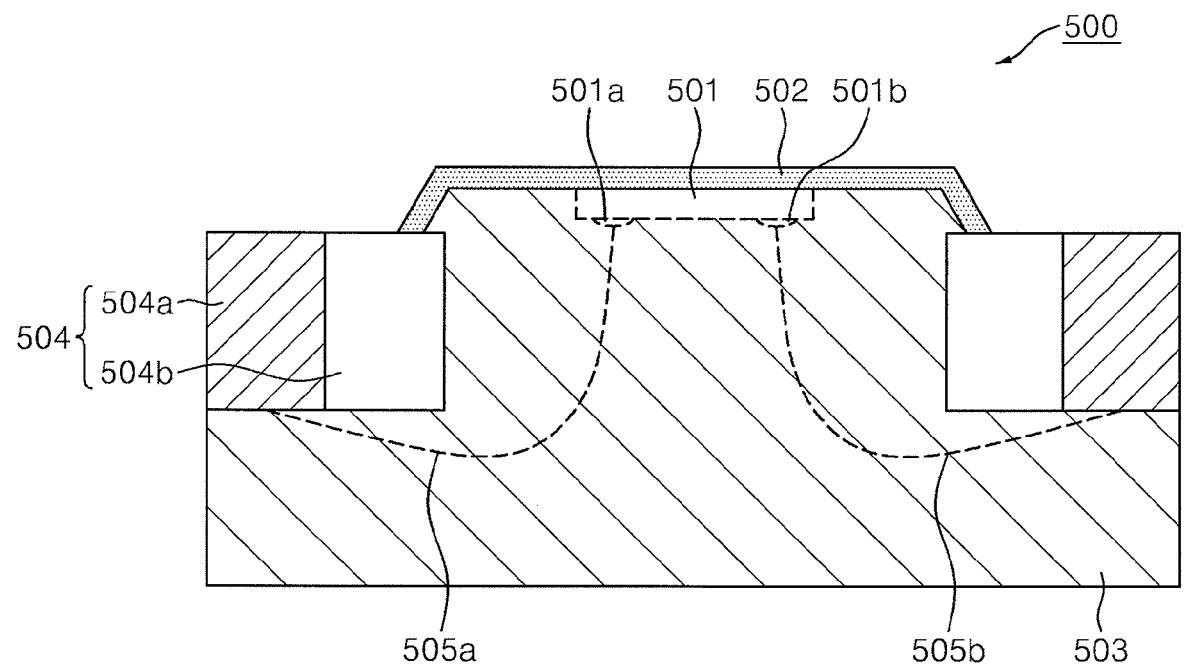
FIG. 5 is a cross-sectional view illustrating a light emitting device according to still another modified embodiment of FIG. 1.

FIGS. 3, 4, and 5 are cross-sectional views illustrating a light emitting device according to modified embodiments of FIG. 1.

First, referring to FIG. 3, in the same manner as FIG. 1, a light emitting device 300 includes a light emitting diode chip 301, a phosphor layer 302, a package body 303 and external terminal blocks 304. The light emitting diode chip 301 is protruded outward from an area between the external terminal blocks 304. The present embodiment is structurally different from the previous embodiment of FIG. 2 as follows. That is, when first and second electrodes 301a and 302b of the light emitting diode chip 301 are electrically connected to the external terminal blocks 304 by wires 305a and 305b, respectively, each of the wires 305a and 305b is not directly bonded to a connecting part 304a but bonded to a conductive via structure 304c formed on a boundary surface between the connecting part 304a and an insulating block 304b. Accordingly, the wires 305a and 305b can be reduced in length while ensuring effective electrical connection.

Next, in the embodiment shown in FIG. 4, in the same manner as FIGS. 1 and 3, a light emitting device 400 includes a light emitting diode chip 401, a phosphor layer 402, a package body 403 and external terminal blocks 404. The light emitting diode chip 401 is protruded outward from an area between the external terminal blocks 404. Also, each of the external terminal blocks 404 includes a connecting part 404a and an insulating block 404b. The connecting parts 404a and the first and second electrodes 401a and 401b are connected together by wires 405a and 405b, respectively. In the present embodiment, a resin layer 406 is formed on each of surfaces of the external terminal blocks 404 facing the same direction as a light emitting surface.

The resin layers 406 serve to protect the external terminal blocks 404 from the outside. Furthermore, the resin layers 406 ensure the light emitting device 400 to be mounted on a PCB more stably. When the light emitting device 400 is mounted on the PCB, a solder material may flow along a corresponding one of surfaces of the connecting part 404a facing the same direction as the light emitting surface. Accordingly, the light emitting device 400 may fall forward, thus undermining the structural stability. However, as in the present embodiment, the resin layers 406 covering the external terminal blocks 404 are formed to ensure that the light emitting device 400 is mounted with structural stability.

As in the embodiment of FIG. 5, in the same manner as the previous embodiments, a light emitting device 500 includes a light emitting diode chip 501, a package body 503 and external terminal blocks 504. The light emitting diode chip 501 is protruded outward in an area between the external terminal blocks 504. Moreover, each of the external terminal blocks 504 includes a connecting part 504a and an insulating block 504b, respectively. The connecting parts 504a and the first and second electrodes 501a and 501b are connected together by wires 505a and 505b. In the present embodiment, a phosphor layer is not directly formed on a light emitting surface of the light emitting diode chip 501. But the phosphor layer 502 is formed to cover a first main surface of the package body 503 to change a wavelength in a wide range.

Figure 6:
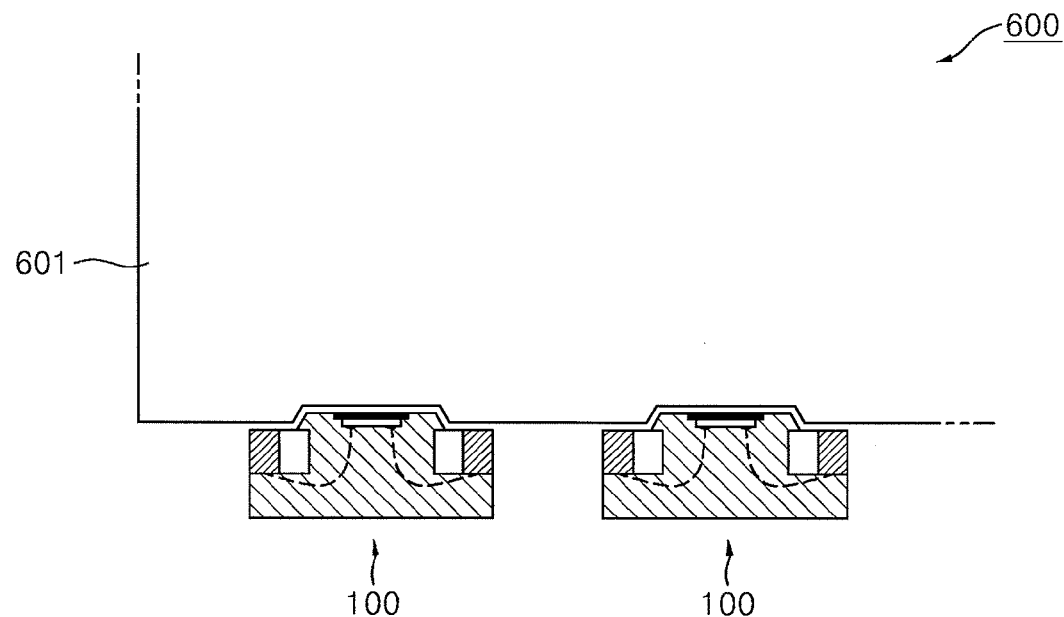
FIG. 6 is a schematic plan view illustrating a structure of a backlight unit employing in a light emitting device structured as shown in FIG. 1.

The light emitting device structured as above may be employed in a backlight unit to perform surface light emission. Particularly, this light emitting device can be effectively connected to a guiding plate. FIG. 6 is a schematic plan view illustrating a backlight unit employing the light emitting device of FIG. 1. Referring to FIG. 6, the backlight unit 600 includes light emitting devices 100 and a guiding plate 601. As described in FIG. 1, each of the light emitting devices 100 has a light emitting diode chip protruded outward. The guiding plate 601 has an incident area where light emitted from the light emitting device 100 is incident. The guiding plate 601 changes a path of the light incident and radiates the light outward.

Notably, in the present embodiment, the incident area of the guiding plate 601 is configured as a groove. The light emitting device 100 is arranged such that a protruded portion thereof is inserted into the groove. This guiding plate 601 structured as a groove is most effective in the light emitting device 100 having a light emitting surface protruded. Also, this structure greatly enhances a ratio of light incident on the guiding plate 601 to the light emitted from the light emitting device 100. Moreover, although not shown, a reflective layer may be formed below the guiding plate 601, and a diffusing sheet and a collimating sheet may be disposed above the guiding plate 601.

Hereinafter, a method of manufacturing a light emitting device structured above will be described.

FIGS. 7A to 7D are procedural cross-sectional views illustrating a process of fabricating a chip array structure in the method of manufacturing a light emitting device according to a first embodiment of the invention.

Figure 7A:
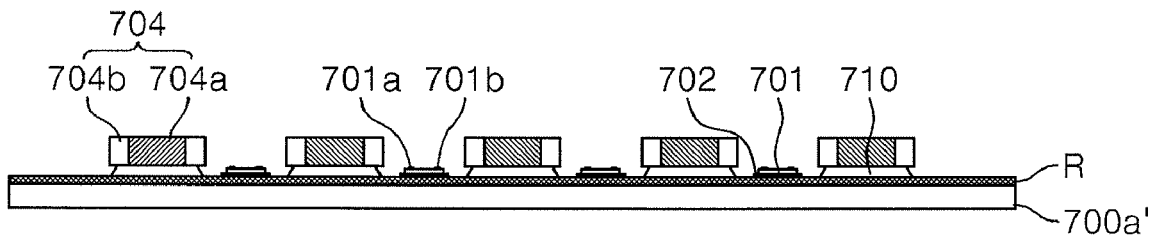
FIGS. 7A to 7D are procedural cross-sectional view illustrating a process of manufacturing a chip array structure in a method of manufacturing a light emitting device according to an exemplary embodiment of the invention.

First, as shown in FIG. 7A, light emitting diode chips 701, first spacers 710 and external terminal blocks 704 are arranged on a first sheet 700a' having a curable material R applied thereon. First and second electrodes 701a and 701b are formed on a surface of each of the light emitting diode chips 701 and a phosphor layer 702 may be formed on an opposing surface, i.e., a light emitting surface of the each of the light emitting diode chips 701. Here, the light emitting diode chip 701 is disposed such that the light emitting surface faces the first sheet 700a'. The first spacer 710 is formed to allow the light emitting diode chip 701 to be protruded outward in a final light emitting device. To this end, a corresponding one of the external terminal blocks 704 is disposed on the first spacer 710. At this time, the first spacer 710 may be bonded using a bonding resin or a curable resin. Each of the external terminal blocks 704 is formed of an insulating block 704b and a conductive material. Also, the external terminal block 704 includes a connecting part 704a extending through the insulating block 704b. The external terminal block 704 is cut in a later cutting process (see FIG. 9E) and may have the connecting part 704a exposed at a cutting surface to serve as an external terminal.

Figure 8:
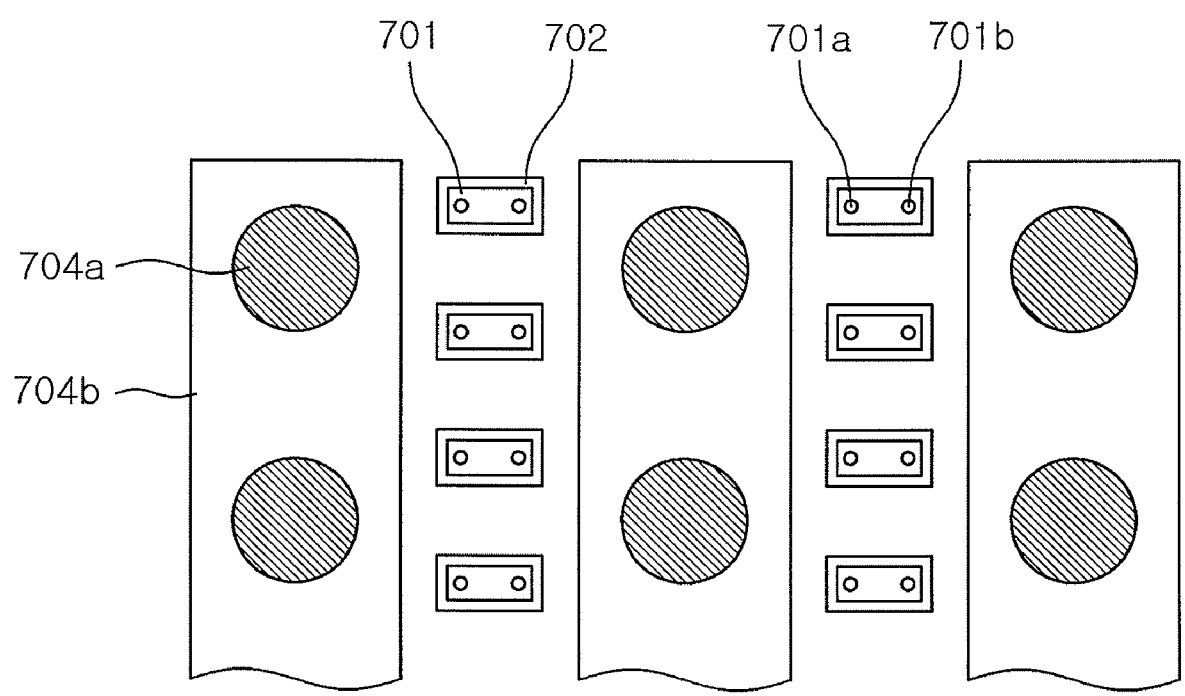
FIG. 8 is a plan view illustrating an arrangement configuration shown in FIG. 7A.

In this arrangement of the present embodiment, as shown in FIG. 8, the each of the external terminal blocks 704 may be configured as a board. FIG. 8 is a plan view of the arrangement shown in FIG. 7A, seen from a top. The external terminal block 704 can be easily manufactured using a PCB. The connecting part 704 of the external terminal blocks 704 may be cut into four units to serve as external terminals belonging to adjacent four light emitting diode chips. Here, the connecting part 704a may be exposed at two adjacent side surfaces formed by cutting. The exposed portions of the connecting part 704a may serve as external terminals.

Figure 7B:
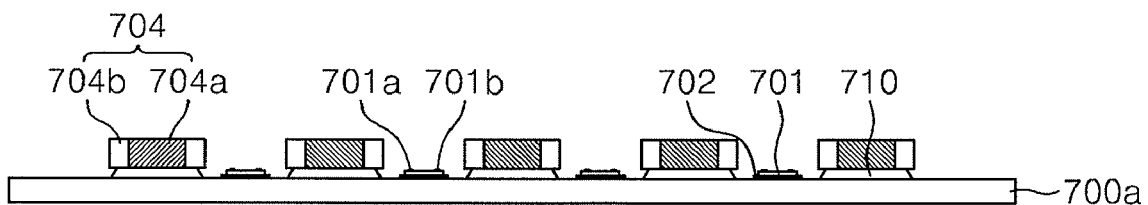

Then, as shown in FIG. 7B, the light emitting diode chips 701 and the external terminal blocks 704 are attached onto the first sheet 700a by a bonding curable material R. This attaching process can be performed by suitably pressing the chips 701 and the external terminal blocks 704 arranged and then employing a curable bonding material.

Figure 7C:
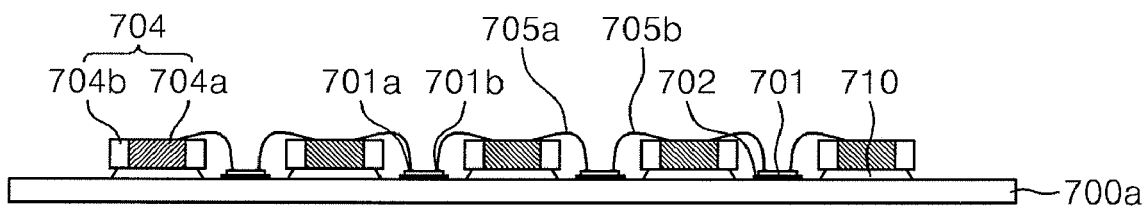
Figure 7D:
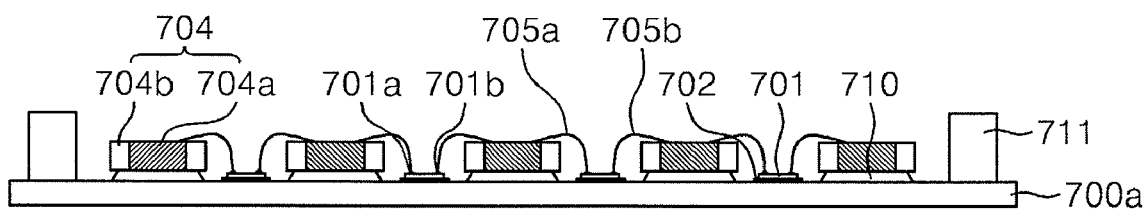

Thereafter, as shown in FIG. 7C, electrodes 701a and 701b of the each of the light emitting diode chips 701 are connected to the exposed portions of the connecting parts 704a of the adjacent external terminal blocks 704 by wires 705a and 705b, respectively. Subsequently, as shown in FIG. 7D, a second spacer 711 is attached on the first sheet 61a to surround the arrangement area of the external terminal blocks 704 and the light emitting diode chips 701. The second spacer 711 may have a height greater than the wires 705a and 705b so that the wires 705a and 705b can be present inside the package body formed of a resin. Like the first spacer 710, the second spacer 711 may be attached by a bonding resin or a curable material.

These processes produce the chip array structure applicable to the present embodiment. The chip array structure shown in FIG. 7D can be fabricated into a plurality of light emitting devices by a series of processes including a resin filling process or a cutting process shown in FIGS. 9A to 9E.

FIGS. 9A to 9E are procedural cross-sectional views illustrating a method of individual light emitting devices in a method of manufacturing a light emitting device according to an exemplary embodiment of the invention.

Figure 9A:
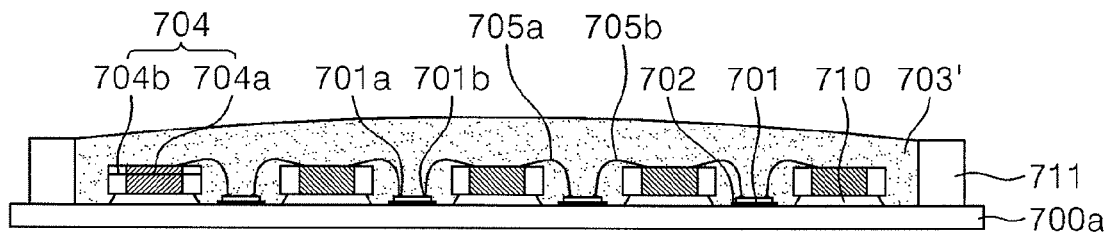
FIGS. 9A to 9E are procedural cross-sectional views illustrating a process of manufacturing an individual light emitting device in a method of manufacturing a light emitting device according to an exemplary embodiment of the invention.

First, as shown FIG. 9A, a curable liquid resin 703' is dropped onto an arrangement area surrounded by a second spacer 711 to be filled therein. The curable liquid resin 703' may be dropped in a sufficient amount to fill an inner space surrounded by the second spacer 711. More specifically, the curable liquid resin 703' is dropped to a height equal to at least a height of the second spacer 711. In the present embodiment, the resin is filled when the chip array structure is disposed in a vacuum chamber and the chamber is decompressed to be in a vacuum or low-pressure state.

Figure 9B:
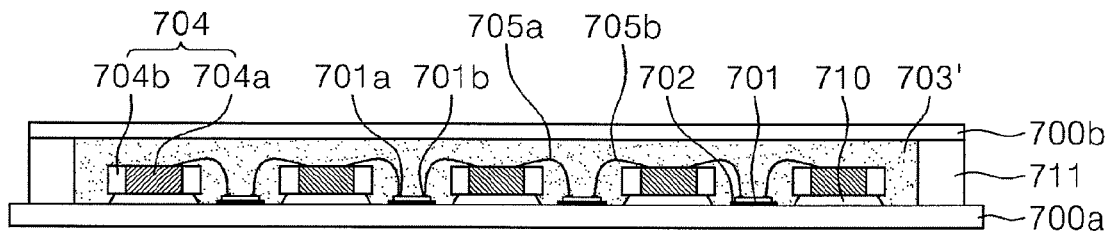

Thereafter, as shown in FIG. 9B, after the chamber is released from decompression, a second sheet 700b is attached on the second spacer 711. When the second sheet 700b is attached on the second spacer 711, the curable liquid resin 703' may be adjusted to a height of the second spacer 711. Also, the suitable compression process employed in this process of attaching the second sheet 700b allows the curable liquid resin 703' to be injected more effectively into an area between light emitting diode chips 701 and external terminal blocks 704. Other follow-up processes along with this process may be performed outside with the chip array structure unloaded after the chamber is released from decompression.

Figure 9C:
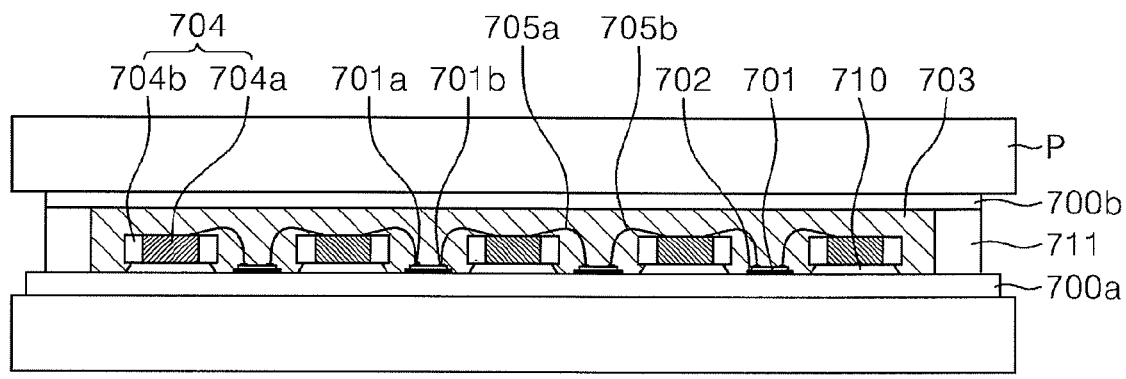

Afterwards, as shown in FIG. 9C, the curable liquid resin 703' filled inside the chip array structure is cured. The curing can be performed by heat or ultraviolet (UV) irradiation according to the type of the curable liquid resin 703'. This process may be directly carried out inside the chamber, but as in the present embodiment, the curing liquid resin may be cured outside the chamber using additional compression equipment P after the chip array structure is collected. The resin cured 703 fastens the external terminal blocks 704 and the light emitting diode chips 701 to each other to provide a single structure and can protect wires 705a and 705b, which are the means for electrical connection.

Figure 9D:
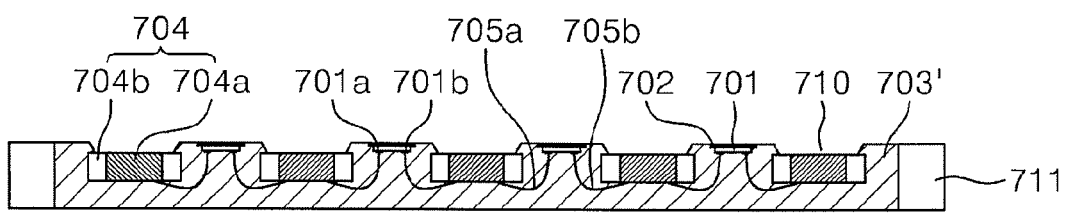

Next, as shown in FIG. 9D, the first and second sheets 700a and 700b are removed from the chip array structure. The chip array structure of FIG. 9D having the first and second sheets 700a and 700b removed therefrom is construed to be a reverse of the chip array structure of FIG. 9C. The first and second sheets 700a and 700b can be removed from the chip array structure by an appropriate known chemical/mechanical method. Meanwhile, in the present embodiment, in an initial stage, a phosphor layer 702 is formed on a light emitting surface of the light emitting diode chip 701. Alternatively, the phosphor layer may be formed in an area corresponding to the light emitting diode chip 701 after this process.

Figure 9E:
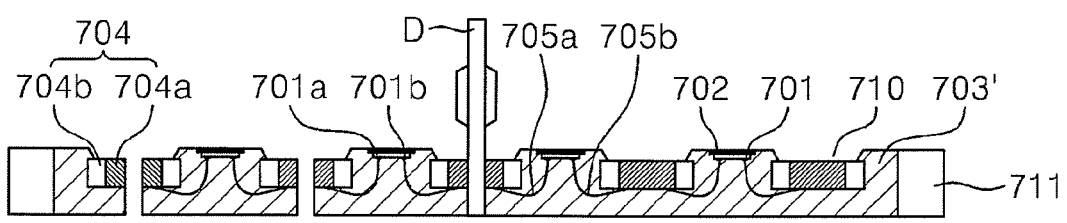

Subsequently, as shown in FIG. 9E, the chip array structure is cut into a plurality of light emitting devices. The cutting may be performed by a dicing device D. As in the present embodiment, in a case where four of the light emitting diode chips 701 are configured to share one of the external terminal blocks, the one external terminal block 704 may be cut into four units to belong to the respective light emitting devices. Here, a conductive via hole, i.e., the connecting part 704a is cut along with the external terminal block 704. Here, the connecting part 704a may be exposed at two adjacent side surfaces formed by the cutting. The exposed portions of the connecting part may serve as external terminal portions.

As set forth above, according to exemplary embodiments of the invention, a compact light emitting device of a novel structure is achieved without involving a process of forming a resin encapsulant in addition to a process of injection-molding a case structure. Also, a light emitting diode chip is protruded from a package body to undergo minimum stress. Furthermore, the light emitting diode chip is inserted into a groove of a guiding plate to obtain a backlight unit improved in light emitting efficiency.

While the present invention has been shown and described in connection with the exemplary embodiments, it will be apparent to those skilled in the art that modifications and variations can be made without departing from the spirit and scope of the invention as defined by the appended claims.

What is claimed is:

1. A light emitting device comprising:
   a package body having opposing first and second main surfaces and a plurality of side surface interposed therebetween, the package body formed of a curable resin;
   first and second external terminal blocks located to oppose each other and each having first and second surfaces formed on the first and second main surfaces and side surfaces interposed therebetween, the first and second external terminal blocks disposed at both ends of the package body, respectively and each including a connecting part having a bonding portion located inside the package body and a terminal portion connected to the bonding portion and exposed outward; and a light emitting diode chip including an electrode forming surface where first and second electrodes are formed and a light emitting surface located opposite to the electrode forming surface, the light emitting diode chip disposed between the first and second external terminal blocks in the package body and having the first and second electrodes electrically connected to the bonding portions of the first and second external terminal blocks, respectively, wherein the first main surface of the package body and the light emitting surface of the light emitting diode chip are protruded outward from the first surfaces of the first and second external terminal blocks.

2. The light emitting device of claim 1, wherein the light emitting surface of the light emitting diode chip and the first main surface of the package body are co-planar with each other.

3. The light emitting device of claim 1, further comprising a phosphor layer formed on the light emitting surface of the light emitting diode chip,
wherein the phosphor layer has an outer surface co-planar with the first main surface of the package body.

4. The light emitting device of claim 3, wherein the light emitting diode chip emits blue light.

5. The light emitting device of claim 1, further comprising a phosphor layer formed on the first main surface of the package body.

6. The light emitting device of claim 5, wherein the light emitting diode chip emits blue light.

7. The light emitting device of claim 1, wherein the curable resin of the package body contains a high-reflectivity powder having electric insulativity.

8. The light emitting device of claim 7, wherein the high-reflectivity powder is a $TiO_2$ powder.

9. The light emitting device of claim 1, further comprising a resin layer formed to cover the first surfaces of the first and second external terminal blocks.

10. The light emitting device of claim 9, wherein the resin layer contains a high-reflectivity powder having electric insulativity.

11. The light emitting device of claim 10, wherein the high-reflectivity powder is a $TiO_2$.

12. The light emitting device of claim 1, wherein the first and second external terminal blocks each are formed of an insulating block having the connecting part.

13. The light emitting device of claim 12, wherein the connecting part comprises an electrode layer formed on the second surface of each of the first and second external terminal blocks and a conductive via hole extending from the second surface to the first surface of the each of the first and second external terminal blocks.

14. The light emitting device of claim 13, wherein the conductive via hole of the each of the first and second external terminal blocks is exposed to the side surfaces of the package body to serve as the terminal portion.

15. The light emitting device of claim 12, wherein the insulating block is one of a ceramic block and a printed circuit board block.

16. The light emitting device of claim 15, wherein the ceramic block comprises a porous structure.

17. The light emitting device of claim 1, wherein the first and second electrodes are electrically connected to the bonding portions of the external terminal blocks, respectively by wire bonding.

18. A backlight unit comprising:
a light emitting device comprising:
a package body having opposing first and second main surfaces and a plurality of side surface interposed therebetween, the package body formed of a curable resin;
first and second external terminal blocks located to oppose each other and each having first and second surfaces formed on the first and second main surfaces and side surfaces interposed therebetween, the first and second external terminal blocks disposed at both ends of the package body, respectively and each including a connecting part having a bonding portion located inside the package body and a terminal portion connected to the bonding portion and exposed outward; and
a light emitting diode chip including an electrode forming surface where first and second electrodes are formed and a light emitting surface located opposite to the electrode forming surface, the light emitting diode chip disposed between the first and second external terminal blocks in the package body and having the first and second electrodes electrically connected to the bonding portions of the first and second external terminal blocks, respectively,
wherein the first main surface of the package body and the light emitting surface of the light emitting diode chip are protruded outward from the first surfaces of the first and second external terminal blocks;
a guiding plate disposed adjacent to the light emitting surface of the light emitting device to change a path of light emitted from the light emitting device and guide the light outward, the guiding plate including a groove formed in a surface facing the same direction as the light emitting surface,
wherein the light emitting device is arranged such that protruded portions of the first main surface of the package body and the light emitting surface of the light emitting diode chip are inserted into the groove.

* * * * *